(12) United States Patent
Kanemura et al.

(10) Patent No.: US 7,842,998 B2
(45) Date of Patent: Nov. 30, 2010

(54) NONVOLATILE SEMICONDUCTOR MEMORY DEVICE AND METHOD FOR MANUFACTURING THE SAME

(75) Inventors: Takahisa Kanemura, Yokohama (JP); Takashi Izumida, Yokohama (JP); Nobutoshi Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/248,449

(22) Filed: Oct. 9, 2008

(65) Prior Publication Data

US 2009/0101959 A1 Apr. 23, 2009

(30) Foreign Application Priority Data

Oct. 10, 2007 (JP) .......................... P2007-264667

(51) Int. Cl.
 *H01L 29/792* (2006.01)
(52) U.S. Cl. ............... 257/326; 257/320; 257/E27.084; 257/E21.646; 438/258; 438/259; 438/593
(58) Field of Classification Search ............. 438/258, 438/259, 589, 593; 257/326, E21.646, 320, 257/E27.084
 See application file for complete search history.

(56) References Cited

U.S. PATENT DOCUMENTS 5,854,500 A * 12/1998 Krautschneider ........... 257/300
6,740,921 B2    5/2004 Matsuoka et al.
6,759,707 B2 *  7/2004 Prall ........................... 257/315
2003/0062565 A1 *  4/2003 Yamazaki et al. ........... 257/315
2005/0285209 A1 * 12/2005 Inoh et al. ................... 257/390
2007/0252196 A1 * 11/2007 Kim et al. ................... 257/329
2008/0296659 A1 * 12/2008 Park et al. ................... 257/324

FOREIGN PATENT DOCUMENTS

| JP | 8-55908 | 2/1996 |
| JP | 11-16381 | 1/1999 |
| JP | 2001-284554 | 10/2001 |

\* cited by examiner

*Primary Examiner*—Thanh V Pham
*Assistant Examiner*—Maria Ligai
(74) *Attorney, Agent, or Firm*—Oblon, Spivak, McClelland, Maier & Neustadt, L.L.P.

(57) ABSTRACT

According to an aspect of the present invention, there is provided a nonvolatile semiconductor memory device including: a semiconductor substrate; memory cell transistors that are series-connected; and a select transistor that includes: a first diffusion region that is formed in the semiconductor substrate at one end of the memory cell transistors; a first insulating film that is formed on the semiconductor substrate at a side of the first diffusion region; a select gate electrode that is formed on the first insulating film; a semiconductor pillar that is formed to extend upward from the semiconductor substrate and to be separated from the select gate electrode; a second insulating film that is formed between the select gate electrode and the semiconductor pillar; and a second diffusion region that is formed on the semiconductor pillar.

19 Claims, 15 Drawing Sheets

NONVOLATILE SEMICONDUCTOR MEMORY DEVICE AND METHOD FOR MANUFACTURING THE SAME

CROSS-REFERENCE TO RELATED APPLICATIONS

This application claims priority from Japanese Patent Application No. 2007-264667 filed on Oct. 10, 2007, the entire contents of which are incorporated herein by reference.

BACKGROUND OF THE INVENTION

A device using, e.g., a NAND-type flash memory which is an electrically rewritable memory has been proposed as a nonvolatile semiconductor memory device. A NAND-type flash memory consists of a plurality of NAND cell units arranged like a matrix. A NAND cell unit consists of a memory string constituted by a plurality of series-connected nonvolatile memory cells, and of two select transistors connected to both ends of the memory string.

A technique using self-boosting is known as that of writing data to a nonvolatile memory cell of a NAND cell unit (see, e.g., JP-11-016381-A). It is recognized that the enhancement of the cut-off characteristic of a select transistor is required to perform self-boosting (see, e.g., JP-2001-284554-A). Further, a sidewall transfer process (or sidewall processing process) of forming a fine pattern exceeding the resolution limit of lithography is known as a technique for miniaturization of a nonvolatile semiconductor memory device (see, e.g., JP-08-055908-A).

SUMMARY OF THE INVENTION

According to an aspect of the present invention, there is provided a nonvolatile semiconductor memory device including: a semiconductor substrate; memory cell transistors that are series-connected; and a select transistor that includes: a first diffusion region that is formed in the semiconductor substrate at one end of the memory cell transistors; a first insulating film that is formed on the semiconductor substrate at a side of the first diffusion region; a select gate electrode that is formed on the first insulating film; a semiconductor pillar that is formed to extend upward from the semiconductor substrate and to be separated from the select gate electrode; a second insulating film that is formed between the select gate electrode and the semiconductor pillar; and a second diffusion region that is formed on the semiconductor pillar.

According to another aspect of the present invention, there is provided a method for forming a nonvolatile semiconductor memory device, the method including: forming memory cell gate electrodes and a select gate electrode on a semiconductor substrate; forming first diffusion regions in the semiconductor substrate in positions between the memory cell gate electrodes and the select gate electrode; forming a insulating film on the semiconductor substrate to cover the memory cell gate electrodes and the select gate electrode; forming a hole in the insulating film to reach the semiconductor substrate at a position side of the select gate electrode; forming a semiconductor pillar in the hole to contact with the select gate electrode through the insulating film; and forming a second diffusion region on the semiconductor pillar.

DETAILED DESCRIPTION OF THE INVENTION

Hereinafter, an embodiment of the invention is described with reference to the accompanying drawings. Incidentally, the invention can be carried out in many different modes. Therefore, the invention should not be interpreted as being limited to embodiments described in the following description. For example, it is assumed in the following embodiments that binary data "0" or "1" is written to each nonvolatile memory cell. However, data to be written thereto is not limited to the binary data. The invention can be applied to a case where the data to be written thereto is multi-level data. Further, the accompanying drawings are schematic. For example, in a drawing for illustrating processing steps, sometimes, the thickness of a layer, a film, or a region, and a patterning width or a patterning depth differ from actual ones.

Embodiment 1

Figure 1A:
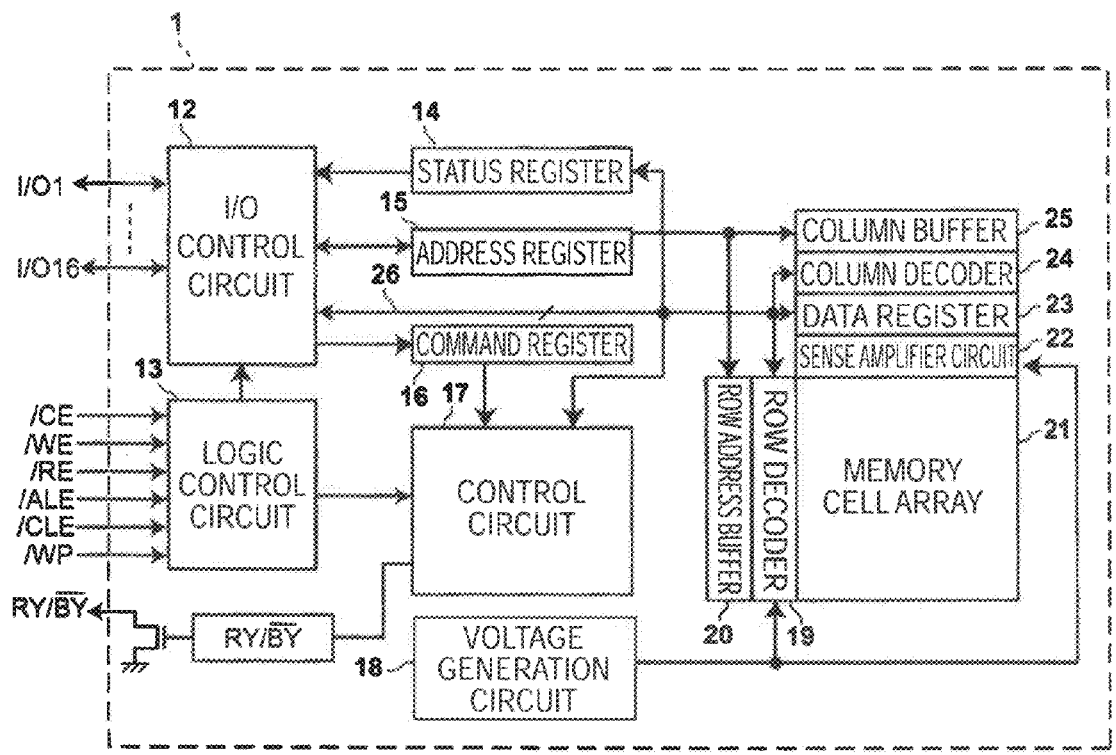
FIG. 1A is a functional block diagram illustrating the configuration of a NAND-type flash memory according to one embodiment of the invention.

FIG. 1A is the functional block configuration of a NAND-type flash memory 1 serving as a nonvolatile semiconductor memory device according to Embodiment 1 of the invention. As illustrated in FIG. 1A, the NAND-type flash memory 1 includes an input/output (I/O) control circuit 12, a logic control circuit 13, a status register 14, an address register 15, a command register 16, a control circuit 17, a voltage generating circuit 18, a row decoder 19, a row address buffer 20, a memory cell array 21, a sense amplifier circuit 22, a data register 23, a column decoder 24, and a column buffer 25.

The I/O control circuit 12 sends and receives data to and from external input/output terminals I/O1 through I/O16 or the data register 23 at a data read time or at a data write time. Further, the I/O control circuit 12 outputs address data, which is input thereto from the external input/output terminals I/O1 through I/O16, to the address register 15. Furthermore, the I/O control circuit 12 outputs a command, which is supplied thereto from the external input/output terminals I/O1 through I/O16, to the command register 16. Moreover, the I/O control circuit 12 outputs status data (i.e., data used to inform an external device of various internal statuses of a chip), which is input thereto from the status register 14, to an external device via the external input/output terminals I/O1 through I/O16. Incidentally, the external input/output terminals are designated with reference numerals I/O1 through I/O16. That is, the number of the external input/output terminals is assumed to be 16. However, the number of the external input/output terminals can be set at a given number.

The logic control circuit 13 outputs external control signals, such as a chip enable signal CE, a write enable signal WE, a read enable signal RE, an address latch enable signal ALE, a command latch enable signal CLE, and a write protect signal WP, to the control circuit 17.

The status register 14 is used to inform an external device of various internal statuses of a chip. The status register 14 includes a ready/busy register that holds data indicating which of a ready status and a busy status the status of a chip is, a write status register that holds data indicating the pass/fail of a write operation, an erroneous write status register that holds data indicating the presence/absence of an erroneous write status (i.e., the pass/fail of an erroneous-write-verify operation), and an excessive write status register that holds data indicating the presence/absence of an excessive write status (i.e., the pass/fail of an excessive-write-verify operation).

The address register 15 decodes address data input from the I/O control circuit 12 and outputs a row address to the row address buffer 20. The address register 15 outputs also a column address to the column buffer 25.

The command register 16 outputs a command, which is input from the I/O control circuit 12, to the control circuit 17.

The control circuit 17 decodes a command input from the command register 16 and outputs the decoded command to the voltage generating circuit 18. Further, the control circuit 17 performs sequence control of data-read, data-write and data-erase operations based on an external control signal input from the logic control circuit 13 and a command input from the command register 16 according to an operation mode.

The voltage generating circuit 18 generates various voltages $V_{pp}$ (e.g., a write voltage $V_{pgm}$, a verify voltage $V_r$, a write pass voltage $V_{pass}$, and a read voltage $V_{read}$) according to an operation mode. The voltage generating circuit 18 is controlled by the control circuit 17.

The row decoder 19 includes a word line drive circuit that selects and drives a word line of the memory cell array 21 according to a row address (page address) stored in the row address buffer 20.

The row address buffer 20 stores a row address input from the address register 15.

The memory cell array 21 is constructed by arranging a plurality of NAND cell units. Each of the NAND cell units includes a memory string, which has a plurality of electrically rewritable series-connected nonvolatile memory cells, and select transistors each connecting both ends of a memory string to a bit line and a source line, respectively. Control gates of the nonvolatile memory cells are connected to different word lines, respectively. A select gate of each of the select transistors is connected to a select gate line extending in parallel to a word line. A set of NAND cell units sharing the word line constitutes a memory block that is a unit of erasing data. A plurality of memory cell blocks may be included in the memory cell array 21.

The sense amplifier circuit 22 reads data, which is stored in a nonvolatile memory cell selected by the row decoder 19 and the column decoder 24, and outputs the read data to the data register 23.

An I/O bus 26 connects between the data register 23 and the I/O control circuit 12. The data register 23 outputs data, which is read by the sense amplifier circuit 22 at a data read time, to the input/output terminals I/O1 to I/O16 via the I/O control circuit 12. Further, at a data write time, the data register 23 outputs write data, which is loaded thereinto from an external controller (not shown) via the input/output terminals I/O1 to I/O16 and the I/O control circuit 12, to the sense amplifier circuit 22. Furthermore, the data register 23 can include a trimming data register (not shown), which is used to store trimming data (e.g., voltage value setting data for adjusting an operating voltage, and clock data for adjusting a clock signal in a memory chip) used when parameters for controlling the operation of the memory all array 21, and a defective block address register (not shown), which stores address data of a defective memory block detected as a result of an operation test.

The column decoder 24 selects a bit line of the memory cell array 21 based on a column address stored in the column buffer 25. The column buffer 25 stores a column address input from the address register 15. The I/O bus 26 is a bus that connects between the I/O control circuit 12 and the data register 23.

Figure 2:
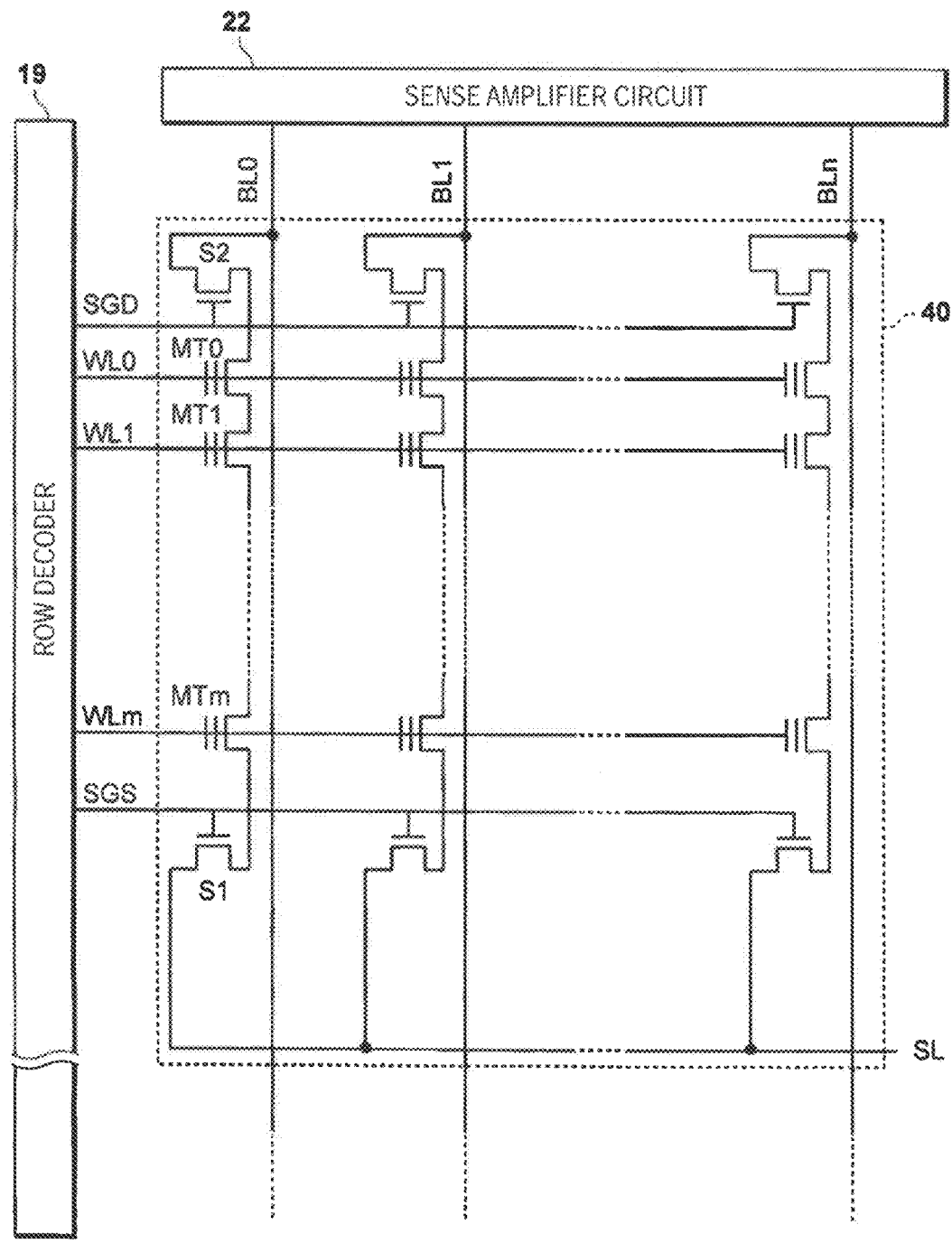
FIG. 2 is a circuit diagram illustrating an electronic circuit equivalent to a memory block of the NAND-type flash memory according to the one embodiment of the invention.

FIG. 2 is a circuit diagram illustrating an electronic circuit equivalent to a memory block 40 that is one of memory blocks included in the memory cell array 21. A NAND cell unit is connected to each of bit lines BL0, BL1, . . . , BLn which are connected to the sense amplifier circuit 22. For example, one NAND cell unit connected to the bit line BL0 includes a memory string constituted by nonvolatile memory cells implemented as series-connected memory cell transistors MT0 through Mtm, a select transistor S1 for connecting one end of the memory string to a common source line SL, and a select transistor S2 for connecting the other end of the memory string to the bit line BL0. Word lines WL0 through WLm connected to the row decoder are connected to the control gates of the memory cell transistors MT0 through Mtm, respectively. Further, one of the select gate lines SGS and SGD is connected to the select gates of the select transistors S1, and the other of the select gate lines SGS and SGD is connected to the select gates of the select transistors S2.

Figure 1B:
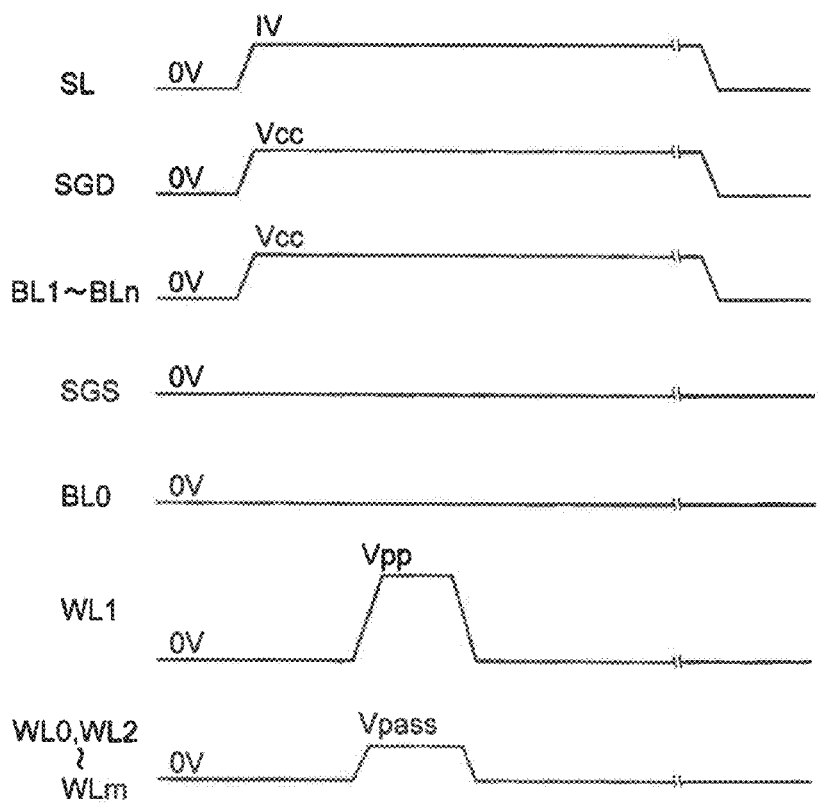
FIG. 1B is a timing chart illustrating a voltage control at writing of data to a nonvolatile memory cell according to one embodiment of the invention.

FIG. 1B is a timing chart of a voltage control on the bit line, the word line, and the select gate line when data "0" is written to the memory cell transistor MT1 (see FIG. 2) constituting the memory string connected to the bit line BL0 using a self-boosting technique.

In an initial step, the voltage of the common source line SL, that of each of the select gate lines SGD and SGS, that of the each of the bit lines BL0 through BLn, and that of each of the word lines WL0 through WLm are 0 V.

In the next step, the voltage of the common source line SL is set at a given voltage of 1 V (the given voltage can be 0 V, instead of 1 V). That of the select gate line SGD is set at, e.g., a voltage Vcc. That of each of the bit lines BL1 through BLn connected to the memory string including only the memory cell transistors to each of which no data is written, is set at, e.g., the voltage Vcc. Further, the voltage of the select gate line SGS is set at 0 V. Consequently, the select transistors connected to the common source line SL are put into an off-state. On the other hand, the select transistor connected to each of the bit lines BL1 through BLn is put into an on-state when the voltage of the bit line corresponding to this select transistor is 0 V, and is put into an off-state when the voltage of the bit line corresponding to this select transistor is Vcc. Therefore, the memory cell transistors of the memory strings respectively corresponding to the bit lines BL1 through BLn are brought into a floating state. Moreover, the memory device is put into a state in which a voltage of 0 V applied to the bit line BL0 can be applied to the memory cell transistors of the memory string connected to the bit line BL0, depending upon the voltage applied to each of the word lines WL0 to WLm.

In the next step, a high voltage Vpp is applied to the word line WL1 connected to the control gate of the memory cell transistor MT1 to which data "0" is written, while a voltage Vpass bringing the memory cell transistors into an on-state is applied to the other word lines WL0, WL2 to WLm. Incidentally, these voltages Vpp and Vpass are set so that Vpp>Vpass. Consequently, the data "0" is written to the memory cell transistor MT1 by applying the high voltage to between the control gate of the memory cell transistor MT1 and a channel. Further, a voltage which does not enable the writing of data "0" to a memory cell transistor is applied to between the control gate of each of the other memory cell transistors and a channel. Thus, data is not written to each of the other memory cell transistors. The memory cell transistors of the memory strings connected to the bit lines BL1 through BLn are brought into a floating state. Thus, the self-boosting of channel potential occurs according to the voltage of each of the word lines WL0 to WLm. Consequently, data "0" is not written to the memory cell transistors other than the memory cell transistor MT1.

Upon completion of writing data "0" to the memory cell transistor, the voltages of the word lines WL0 to WLm are put back to 0 V. Thereafter, the voltage of the source line SL, that of the select gate line SGD, and those of the bit lines BL1 through BLn are put back to 0 V.

Incidentally, FIG. 1B illustrates that the voltage of the word line WL1 is set at the voltage Vpp only once. However, a higher voltage can be applied to the word line WL1 in a case where after a certain voltage is applied to the word line WL1, where it is verified whether data "0" is written to the memory cell transistor MT1, and where it is detected that data "0" is written to the memory cell transistor MT1.

Figure 3A:
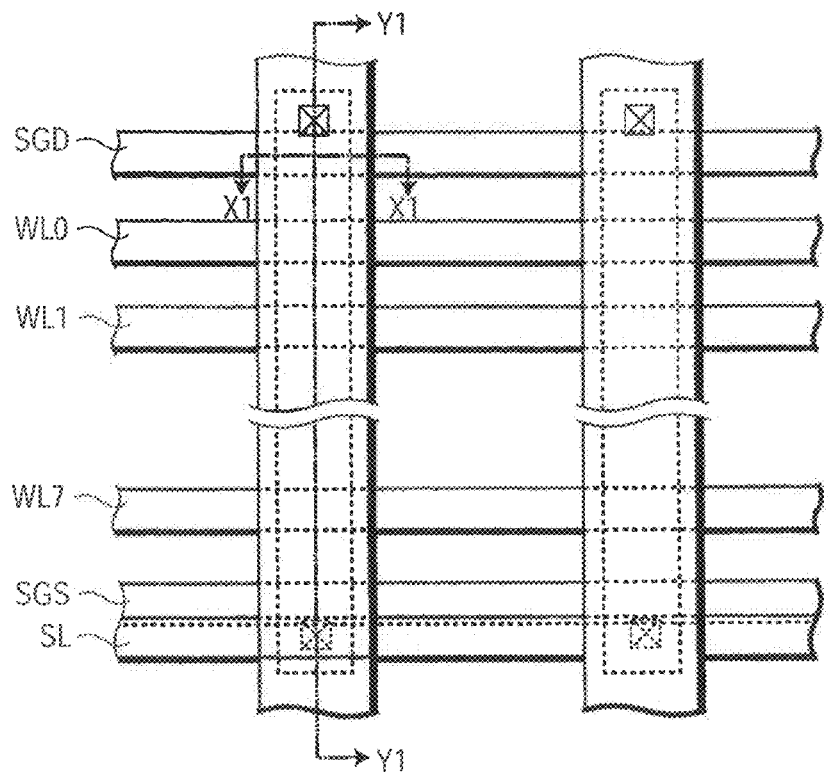
FIG. 3A is a plan diagram illustrating a laminated structure of a memory block of the NAND-type flash memory according to Embodiment 1 the invention.

FIG. 3A is a plan diagram illustrating a semiconductor laminated structure that implements the memory block 40 according to Embodiment 1. FIG. 3A illustrates a laminated structure that implements adjacent two NAND cell units. Element regions for implementing NAND cell units are present in the bottom layer in this laminated structure. In an upper layer formed on the bottom layer, electrical conductor regions implementing the select gate line SGD, the word lines WL0 through WL7, and the select gate line SGS are present. In a further upper layer formed on the upper layer, an electrical conductor region implementing the common source line SL is present. Moreover, electrical conductor regions implementing the bit lines are present in the top layer. The bit lines and one end of each of the NAND cell units formed in the element regions is connected to each other using a contact (hereunder referred to as a "bit line contact"). Furthermore, the common source line SL and the other end of each of the NAND cell units formed in the element regions are connected to each other using another contact (hereunder referred to as an "SL line contact").

Hereinafter, it is assumed that among the electrical conductor regions that implement the bit lines, a left-side one corresponds to the bit line BL0 in FIG. 2, as viewed in FIG. 3A. The associated select transistor S2 is present in an area in which this electrical conductor region intersects with the select gate line SGD. Further, the associated select transistor S2 is connected to the bit line by the bit line contact. Further, each of the memory cell transistors MT0 through Mtm is present in an area in which an associated conductive layer and an associated one of the word lines WL0 through WLn intersect with each other. Moreover, the select transistor S1 is present in an area in which an associated conductive layer and the select gate line SGS intersect with each other. Furthermore, the select transistor S1 is connected to a common source line SL by the SL line contact.

Figure 3B:
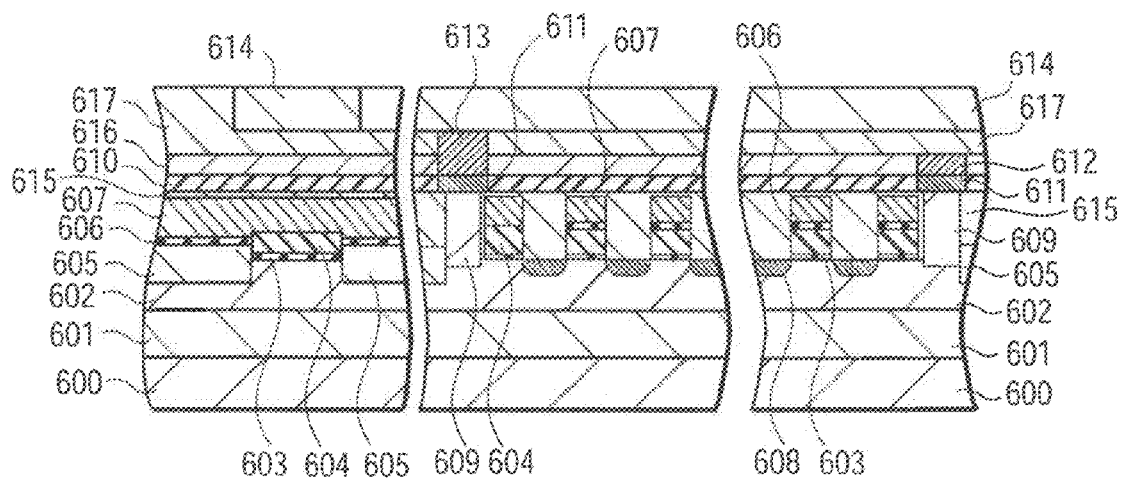
FIG. 3B is a diagram illustrating the laminated structure of a memory block of the NAND-type flash memory according to Embodiment 1.

In a left-side part of FIG. 3B, a cross-sectional diagram (hereunder referred to as an "X1-cross-sectional diagram") taken on line X1-X1 shown in FIG. 3A, which illustrates the semiconductor having the laminated structure, whose plan diagram is shown in FIG. 3A, is illustrated. Further, in a right-side part of FIG. 3B, a cross-sectional diagram (hereunder referred to as an "Y1-cross-sectional diagram") taken on line Y1-Y1 shown in FIG. 3A is illustrated. That is, the X1-cross-sectional diagram illustrates a cross-section that includes the select gate of the select transistor S2, the select gate line SGD, and the bit line. Further, the Y1-cross-sectional diagram illustrates a cross-section that includes the NAND cell unit and the bit line. As illustrated therein, a P-type substrate 600, an N-well 601 and a P-well 602 are formed to be arranged in this order from the bottom. Hereinafter, the P-type substrate 600, the N-well 601 and the P-well 602 are collectively called a "substrate".

First, the X1-cross-sectional diagram is referred to. An insulating layer 603 made of, e.g., silicon oxide is formed on the substrate. Shallow trench isolation (STI) regions 605 for element isolation are formed on the left and right sides of the insulating layer 603. An element region is formed between the STI regions 605. That is, the insulating layer 603 is formed between the element isolation regions. A conductive layer 604 implementing the structure of the select gate of the select transistor is formed on the insulating layer 603. An insulating layer 606 is formed on the STI region 605 and on side surfaces of the conductive layer 604. A conductive layer 607 implementing the select gate line SGD is formed over the conductive layer 604 and the insulating layer 606. An insulating layer is formed on the conductive layer 607. A conductive layer 614 implementing the bit line is formed in this insulating layer.

Incidentally, a cross-section including the select gate of the select transistor S1 and the select gate line SGS is illustrated by a cross-sectional diagram that is similar to the aforementioned X1-cross-sectional diagram.

Next, the Y1-cross-sectional diagram is referred to. A plurality of diffusion regions 608 implementing the nonvolatile memory cells and the source or the drain of the select transistor are present in an upper portion of the substrate. The diffusion regions 608 are referred to also as "first diffusion regions". Additionally, a semiconductor pillar 609 is connected to the substrate. The semiconductor pillar 609 is a P-type semiconductor as similarly to the P-well 602. The channel region of the select transistor is formed in the semiconductor pillar 609 and in a portion of the P-well 602 positioned below the select gate (conductive layer 604).

Insulating layers 603 are formed on the substrate at portions on which the electric charge storage layer and the control gate of the nonvolatile memory cells and the select gate of the select transistors are formed. That is, the electric charge storage layer and the control gate of each of the nonvolatile memory cell and the select gate of the select transistor are formed on the insulating layers 603. The select gate of each of the select transistors is formed so that the associated conductive layers 604 and 607 are conducted to each other.

By the above-described structure, the channel length of the select transistors can be increased, thereby enhancing the cut-off characteristic thereof. Further, by increasing the height of the select gate, since the channel length can be enhanced, the width of the select gate can be reduced while maintaining the channel length of the select transistor. Therefore, by decreasing the width of the select gate, the substrate occupying area of the select transistor can be reduced without deteriorating the cut-off characteristic of the select transistor. Specifically, the area occupied by the select gate of the select transistor on the substrate can be reduced while the cut-off characteristic of the select transistor is improved by setting the height of the select gate to be larger than the width thereof.

On the other hand, each of the nonvolatile memory cells is formed using the associated conductive layers 604 and 607 partitioned by the insulating layer 606. Each of the conductive layers 604 functions as the electric charge storage layer. The conductive layers 608 function as the control gates and the word lines.

The diffusion layer 611 is formed on each of the semiconductor pillars 609. The diffusion regions 611 are referred to also as "second diffusion regions". A channel is formed in each of the semiconductor pillars 609 between the first diffusion region and the second diffusion region by applying a voltage to the select gate of the select transistor. In Embodiment 1, the channel length is substantially equal to a sum of the width and the height of the select gate of the select transistor. As described above, the area occupied by the select gate of the select transistor on the substrate can be reduced with maintaining the channel length, i.e., without deteriorating the cut-off characteristic of the select transistor by increasing the height of the select gate of the select transistor while the width of the select gate is reduced.

Incidentally, the "cut-off characteristic" can be defined as a ratio of a source-drain current (channel current) when a given positive voltage is applied to the select gate of the select transistor so that the select transistor is turned on to a source-drain current when a voltage of around 0 V is applied to the select gate so that the select transistor is turned off. According to this definition, when measuring the magnitude of the source-drain current at the turn-off of the select transistor and that of the source-drain current at the turn-on thereof by applying the same voltage to the select gate of the select transistor, in a case where a ratio of the magnitude of the source-drain current at the turn-on of the select transistor to that of the source-drain current at the turn-off thereof is large, it is determined that the select transistor has a good cut-off characteristic.

A region 612 is a conductive layer that implements the common source line. A region 613 is a contact that connects the select transistor to the bit line. A conductive layer 614 implementing the bit line is present on the region 613.

Layers 610, 616, and 617 are insulating layers. The second diffusion region 611 is provided in the layer 610. The common source line and a lower portion of the contact 613 are provided in the layer 616. An upper portion of the contact 613 is provided in the layer 617. Sometimes, the layers 610, 616, and 617 are discriminated from one another only for convenience sake. For example, all or two adjacent ones of the layers 610, 616, and 617 may be formed as a single layer.

Hereinafter, steps of a process for implementing the laminated structure illustrated in FIGS. 3A and 3B are described.

Figure 4A:
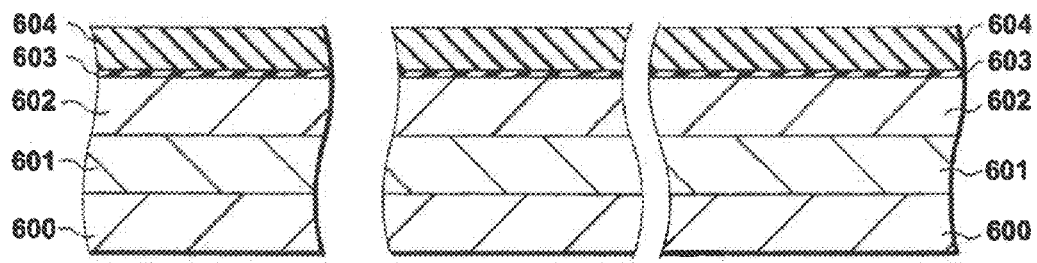
FIGS. 4A to 8C are diagrams respectively illustrating steps of processing a memory block of the NAND-type flash memory according to Embodiment 1.

First, a structure in which the N-well 601, the P-well 602, and the insulating layer 603 are stacked on the P-type substrate 600 and in which the conductive layer 604 made of polysilicon is additionally stacked on the insulating layer 603, as illustrated in FIG. 4A, is prepared. This structure is formed as follows. That is, first, a P-type silicon substrate is prepared. Then, the insulating layer 603 is formed by thermally oxidizing the top surface of the P-type silicon substrate or depositing silicon oxide on the P-type silicon substrate using a chemical vapor deposition (CVD) method. Moreover, the N-well 601 and the P-well 602 are sequentially formed by ion implantation. Then, the conductive layer 604 made of polysilicon is stacked on the insulating layer 603. Incidentally, the conductive layer 604 made of polysilicon can be stacked thereon after a silicon oxide film (hereunder sometimes referred to simply as an "oxide film") 603 is formed by performing thermal oxidization subsequent to the formation of the N-well 601 and the P-well 602. Alternatively, the conductive layer 604 made of polysilicon can be stacked thereon after the insulating layer 603 is formed by forming a silicon oxide film layer once through thermal oxidization, then performing ion implantation, peeling the silicon oxide film layer, performing thermal oxidization again, and depositing silicon oxide using a CVD method. The conductive layer 604 is serving as the electric charge storage layer of each nonvolatile memory cell and as a part of the select gate of each select transistor.

Figure 4B:
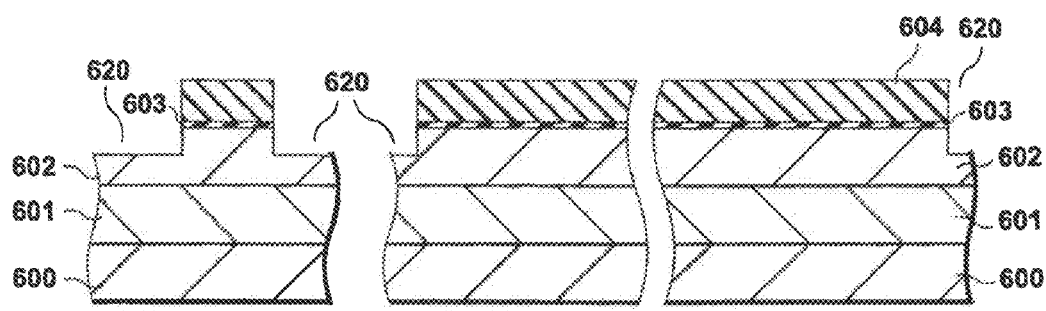
Figure 4C:
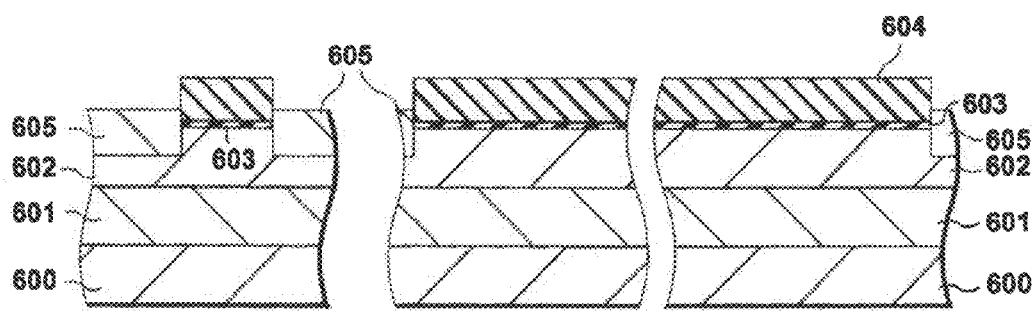

Then, photoresist is applied to the top surface of the structure illustrated in FIG. 4A. A pattern for forming the STI region 605 is formed on the photoresist. Next, anisotropic etching such as reactive ion etching (RIE) is performed. Consequently, a trench region 620 is formed, as illustrated in FIG. 4B. Then, as illustrated in FIG. 4C, the trench region 620 is filled with an insulating material such as a silicon oxide film. Subsequently, etching is selectively performed on the insulating material filled in the trench region. Consequently, as illustrated in FIG. 4C, the STI region 605 is formed.

Incidentally, in a case where polysilicon is used as the material of the conductive layer or film 604, to reduce the resistance of the conductive layer 604, an N-type impurity such as phosphorus or arsenic can be introduced into the conductive film 604 by thermal diffusion before or after the formation of the STI region 605.

Figure 5A:
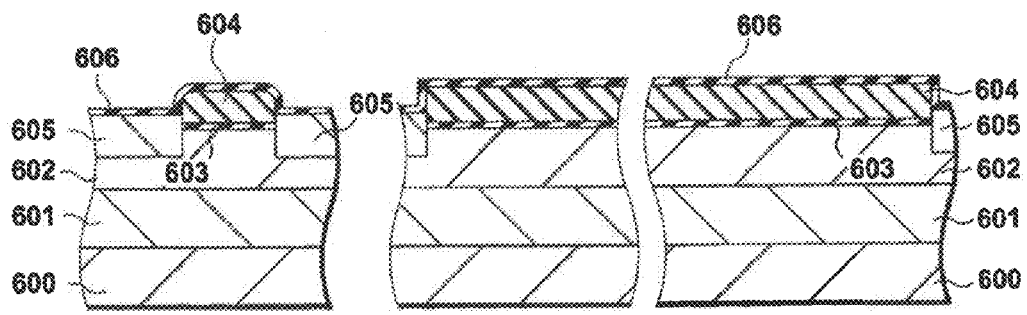

Then, the insulating layer 606 is formed on the top surface of the structure illustrated in FIG. 4C, using a chemical vapor deposition (CVD) method. Consequently, a structure, in which the conductive layer 604 is surrounded by the insulating layers 603 and 606 and the STI region 605, as in FIG. 5A, is obtained.

Figure 5B:
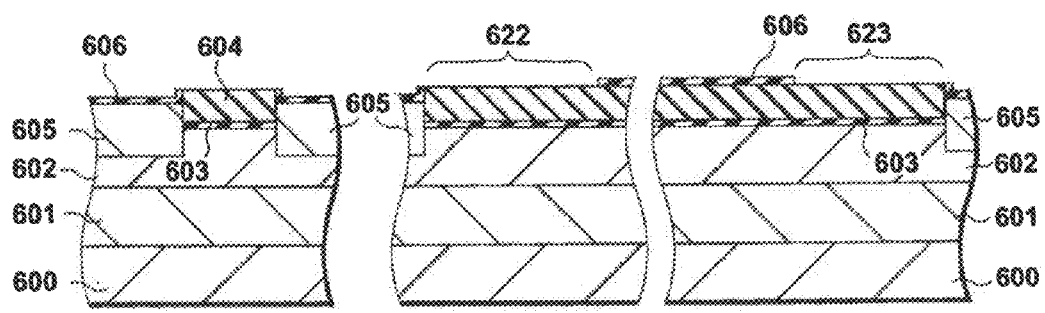

FIG. 5B illustrates a structure obtained by etching regions 622 and 623, which constitute a part of the series-connected nonvolatile memory cells of one memory string other than the electric charge storage layers, in the insulating layer 606. This structure is obtained by applying photoresist on the top surface of the structure illustrated in FIG. 5A, forming the patterns of the regions 622 and 623, and performing etching. The regions 622 and 623 include a part in which the select transistors, the bit line contact, and the SL line contact are formed.

Figure 5C:
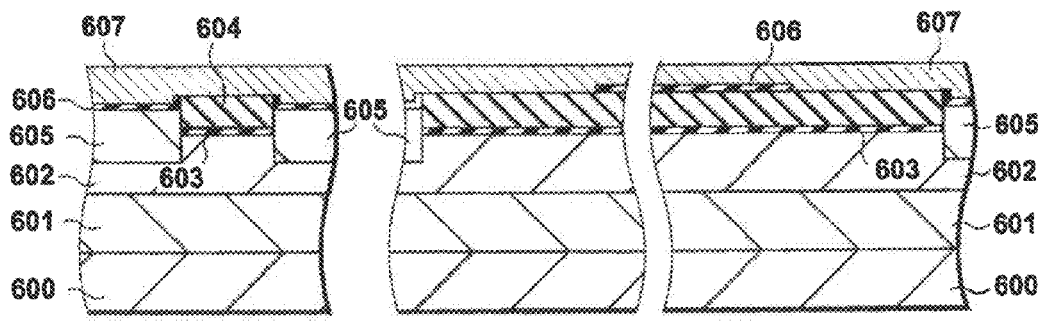

FIG. 5C illustrates a structure obtained by forming another conductive layer 607 on the structure illustrated in FIG. 5B. This conductive layer 607 is formed using, e.g., polysilicon. The conductive layer 607 is used to form the word lines, the control gates of the nonvolatile memory cells, the select gates, and the select gate lines. Thus, similarly to the conductive layer 604, processing for reducing the resistance can be performed.

Figure 6A:
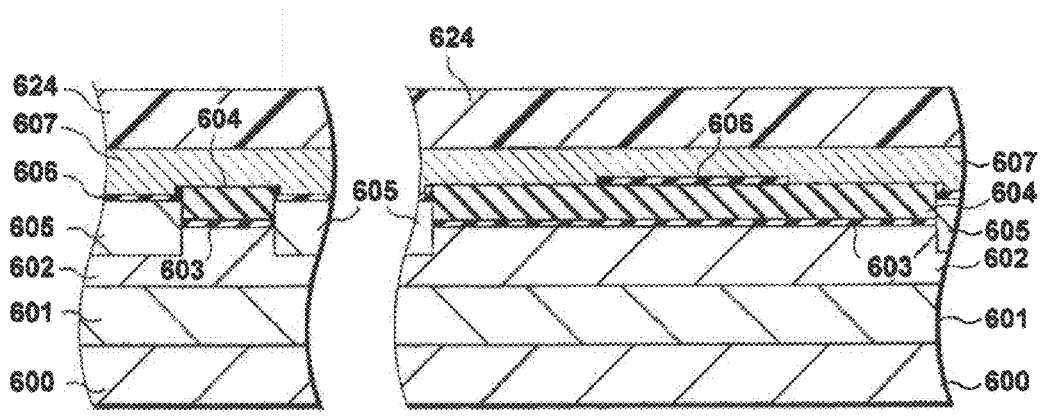

FIG. 6A illustrates a state in which photoresist 624 is applied onto the structure illustrated in FIG. 5C. The photoresist 624 is applied thereto to form a straight space extending in a direction perpendicular to the plane of the drawing in the insulating layer 603, the conductive layer 604 and the insulating layer 606. The nonvolatile memory cells and the select gates of the select transistors are formed by being isolated from one another. Additionally, a region, in which the semiconductor pillar 609 is to be formed, is formed.

Figure 9A:
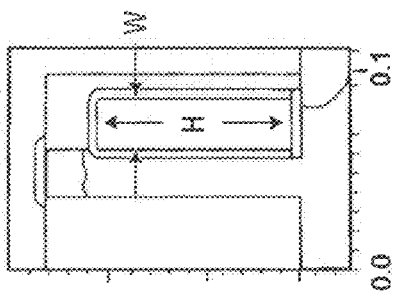
FIG. 9A is a cross-sectional structure diagram illustrating a select transistor in another configuration.
Figure 9B:
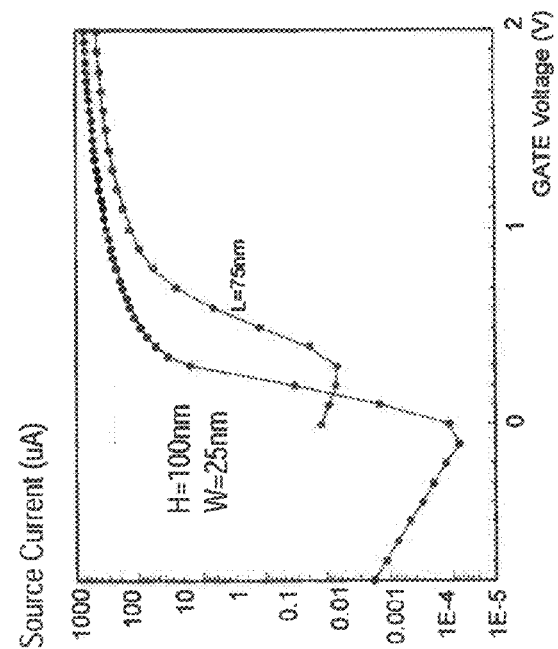
FIG. 9B is a graph illustrating the cut-off characteristic of the select transistor in another configuration.
Figure 9C:
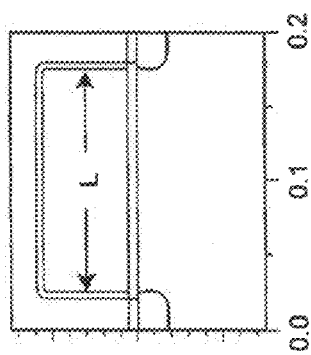
FIG. 9C is a cross-sectional structure diagram illustrating a select transistor according to Embodiment 1.

Each of the select transistors can be obtained by the process of forming an oxide film and a select gate on a P-well in this order and then forming a diffusion region in the P-well to thereby form a channel in a part of the P-well under the select gate illustrated in FIG. 9C after. In this process, it is necessary for enhancing the cut-off characteristic of the select transistor that the width of the select gate is set to be larger than the width of each nonvolatile memory cell. Thus, the pattern for forming the nonvolatile memory cells by being isolated from one another can be formed by a sidewall transfer process, whereas it is difficult for the sidewall transfer process to form the pattern for forming the select gate. Accordingly, it is necessary that the processing steps for forming the nonvolatile memory cells by being isolated from one another are separated from the processing steps for forming the select gate. However, according to the invention, the width of the select gate can be set to be comparable with that of each nonvolatile memory cell. Thus, the pattern for forming the nonvolatile memory cells by being isolated from one another and the pattern for forming the select gate can be formed by performing the sidewall transfer process once.

Figure 6B:
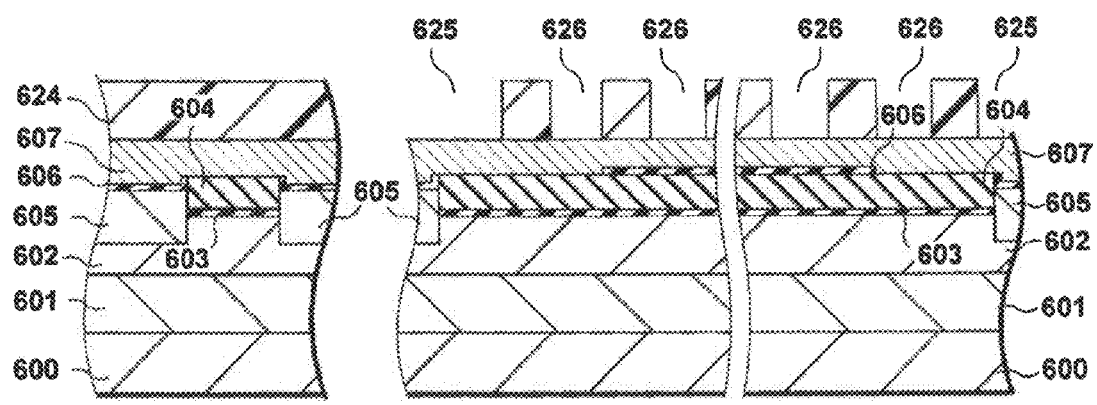

FIG. 6B illustrates a state in which patterns 625 and 626 are formed on the photoresist 624.

Figure 6C:
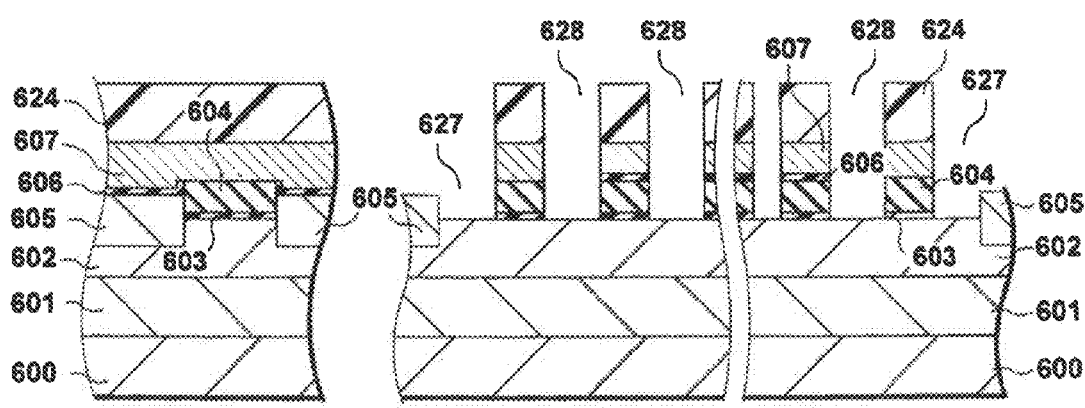

FIG. 6C illustrates a structure in which the nonvolatile memory cells and the select gates of the select transistors are separated from one another by performing etching the patterns 625 and 626 to thereby form straight spaces 627 and 628.

Figure 7A:
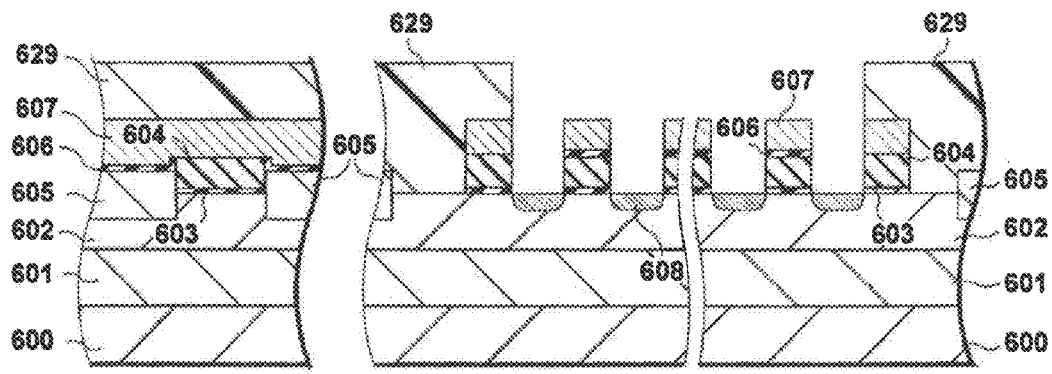

FIG. 7A illustrates a structure in which diffusion regions (first diffusion regions) 608 are formed by performing ion implantation from the top surface of the structure illustrated in FIG. 6C, introducing N-type impurities into a bottom portion of the region 628, and performing diffusion through heating. Incidentally, before the ion implantation, a protection layer 629 is formed in order not to perform ion implantation on the bottom surface of the region 627.

Figure 7B:
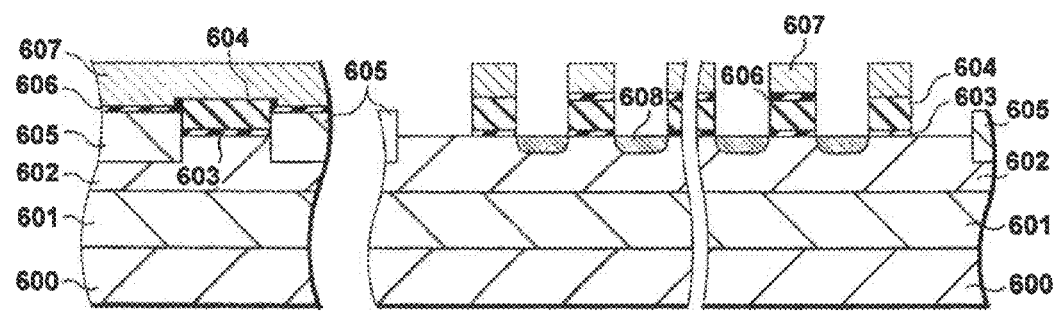
Figure 7C:
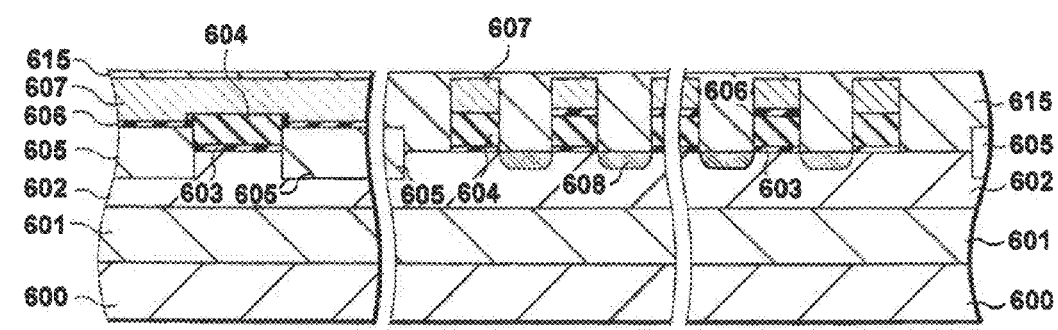

FIG. 7B illustrates a structure in which the protection layer 629 is eliminated from the structure illustrated in FIG. 7A. In this structure, the select gate of the select transistor S2, the electric charge storage layers and the control gates of the nonvolatile memory cells of the memory string, and the select gate of the select transistor S1 are arranged in an order from left to light as viewed in FIG. 7B (the select transistor S2 and the select transistor S1 can be replaced with each other according to the direction of viewing the structure, and it is assumed for simplification of description that the select transistor S2 is present at a left side part of FIG. 7B). An insulating layer made of an insulating material is formed on this structure. For example, phosphor silicate glass (PSG) is used as the insulating material. Alternatively, after an oxide film is formed on the entire part of the surface of the substrate in the structure illustrated in FIG. 7B, the entire surface of the formed oxide film is covered with the insulating material, such as PSG, if necessary. In a case where a sufficiently thick oxide film can be deposited, it may be unnecessary to cover the surface of the oxide film with PSG. Subsequently, planarization is performed utilizing, e.g., chemical mechanical planarization (CMP). Consequently, the structure illustrated in FIG. 7C is obtained. That is, the structure formed on the top surface of the substrate is covered with the insulating layer 615.

Figure 8A:
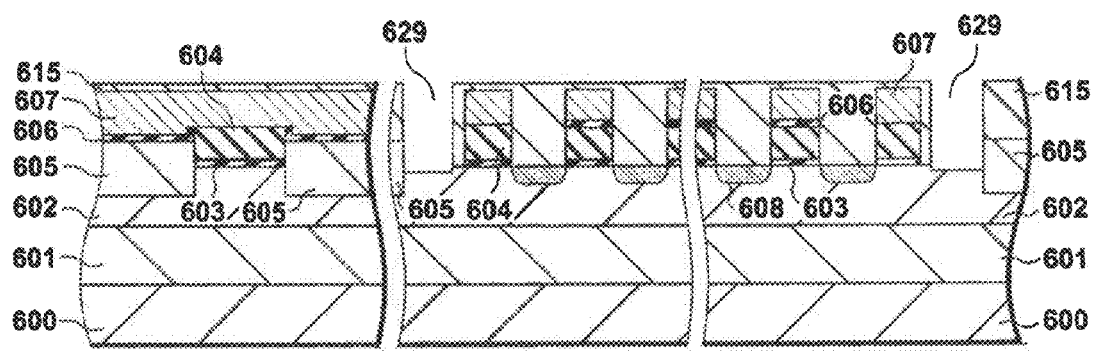

FIG. 8A illustrates a structure in which a hole 629 that extends from the top surface of the insulating layer 615 of the structure illustrated in FIG. 7C and that reaches the P-well 602 is formed. The hole 629 is formed by performing, e.g., the following steps. That is, in a first step, a first hole that extends from the top surface of the insulating material 615 and that reaches the surface of the substrate is formed by performing etching such that the inner surface of the first hole is contacted with the select gates 604 and 607 of the select transistors S2 and S1 or that a part of each of the select gates 604 and 607 is eroded in a horizontal direction by etching. In a second step, an oxide film is formed on the inner surface of the first hole. Then, in a third step, anisotropic etching of the oxide film formed on the bottom surface of the first hole is performed using reactive ion etching (RIE). Consequently, the hole 629 is formed as a second hole. At the etching for forming the hole 629, it is advisable to perform over-etching to slightly etch the top surface of the P-well 602. This is because when the oxidized layer 603 remains on the bottom surface of the first hole, between the semiconductor pillar 609 to be formed and the P-well 602, a channel formation can be blocked.

In a case where the insulating material 615 is a material, such as an oxide film, suited to be used between the select gate and the semiconductor pillar 609, the first step and the second step may be omitted and only the third step may be performed. That is, in the insulating material 615, the hole 629 may be formed slightly apart from the select gate 604, 607 so that the select gate 604, 607 is not exposed through the insulating material 615. In this case, a distance from the select gate to a position, at which the hole 629, is nearly equal to the thickness of the insulating layer 603. Incidentally, when a large number of nonvolatile semiconductor memory devices having similar performance are manufactured in this way, it is preferable that the distances from the select gates to the hole are substantially equal to one another for all the select gates included in lots so that substantially no variation in the distance from the select gate to the hole is present among lots, and in each lot.

Figure 8B:
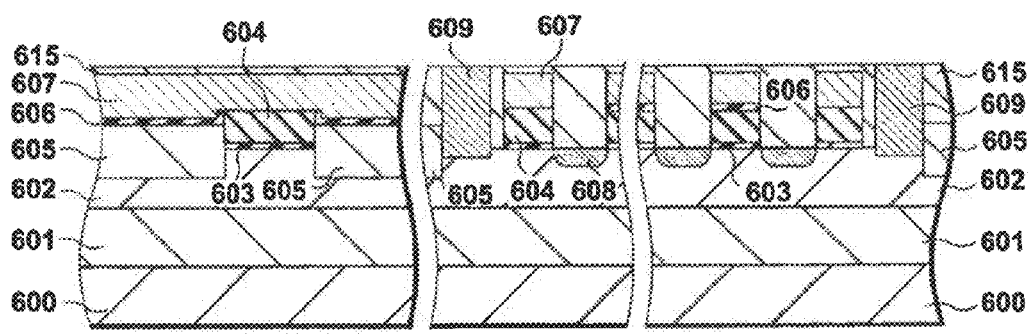

FIG. 8B illustrates a structure in which the semiconductor pillar 609 is formed in a hole 629 of the structure illustrated in FIG. 8A. The semiconductor pillar 609 is formed by epitaxially forming a semiconductor the conductivity type of which is P-type, similarly to the P-well 602, and subsequently performing planarization of the top surface thereof using, e.g., CMP.

Figure 8C:
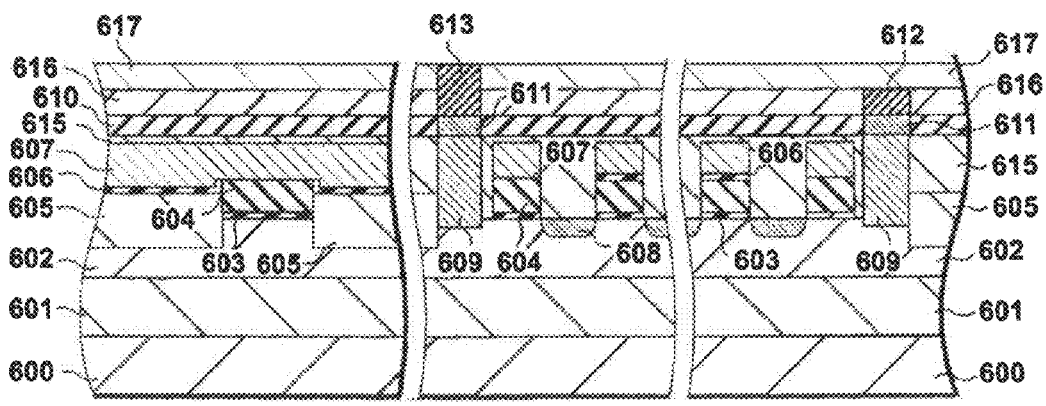

FIG. 8C illustrates a structure obtained by performing processing in the following steps (1) through (9). That is, in step (1), the insulating layer 610 is formed on the top surface of the structure illustrated in FIG. 8B. In step (2), a hole, in which the diffusion region 611 (second diffusion region) is to be epitaxially formed, is formed in the insulating layer 610 on the semiconductor region 609. In step (3), the hole is filled with the P-type semiconductor by epitaxially forming the P-type semiconductor. In step (4), a diffusion region 611 (second diffusion region) is formed by performing thermal diffusion of the P-type semiconductor filled therein after ion implantation is performed thereon. Further, in step (5), the insulating layer 616 is further formed on the top surface of each of the insulating layer 610 and the diffusion regions 611. In step (6), the common source line 612 is formed on one of the diffusion regions 611. Consequently, the SL contact line for connecting the common source line to the P-well 602 is formed. Furthermore, in step (7), the insulating layer 617 is further formed on the top surface of each of the insulating layer 616 and the common source line 612. In step (8), a hole is formed in the insulating layers 616 and 617 and on the other diffusion region 611. In step (9), the contact 613 connected to the bit line is formed. Thus, a bit line contact for connecting a bit line, which will be formed later, and the P-well 602 is formed.

Incidentally, ion implantation can be performed on the semiconductor pillar 609 from the upper surface in the structure illustrated in FIG. 8A without performing steps (1), (2) and (3). In this case, since the second diffusion region is formed in an upper portion of the semiconductor pillar 609, the channel length becomes small. Thus, in the case of omitting steps (1), (2), and (3), preferably, the insulating layer 615 may be formed sufficiently thick. More specifically, preferably, the second diffusion region may be positioned higher than the top surface of the select gate. In this case, it is unnecessary to form the insulating layer 616 in step (5).

Subsequently, the bit line 614 is formed on the top surface of each of the insulating layer 617 and the contact 613. Thus, the aforementioned structure illustrated in FIG. 3B is obtained.

As described above, in the NAND flash memory according to Embodiment 1, the first diffusion region at an end of the memory string is functioning as one diffusion region, the semiconductor pillar arranged on a side of the select gate through the insulating film is functioning as a part of a channel region, and the second diffusion region formed on the semiconductor pillar is functioning as the other diffusion region. Consequently, the number of the first diffusion regions per NAND cell unit can be reduced. Further, the length of a channel formed by the select transistor is nearly equal to a sum of the height and the width of the select gate, the channel length can be increased by increasing the height of the select gate. Alternatively, the height of the select gate can be increased with reduction in the width thereof. Consequently, an area occupied by the select transistor on the substrate can be reduced without deteriorating the cut-off characteristic of the select transistor. Consequently, the miniaturization of a nonvolatile semiconductor memory device can be implemented without deteriorating the performance thereof.

FIG. 9A illustrates a cross-sectional structure of the select transistor used in the NAND cell unit, which has a configuration differing from the aforementioned configuration. The select transistor having the different configuration has a structure in which an oxide film and a select gate are formed on a P-well in this order and in which each diffusion region is formed in the P-well so that a channel is formed in the P-well under the select gate. In the select transistor in this configuration, the channel length is nearly equal to the width L of the select gate.

FIG. 9B illustrates the relationship between a gate voltage and a source-drain current flowing through the channel, which is obtained as a result of simulation, in the cases of setting the width L of the select gate of the select transistor in this configuration at 50 nm, 75 nm, and 150 nm, respectively. Incidentally, a condition for simulation is that the acceptor density (Na) of P-well is $1\times10^{18}$ cm$^{-3}$. At energy of 5 keV, ion implantation of arsenic ions into the diffusion region is performed so that an amount of the arsenic ions is $2\times10^{13}$ cm$^{-2}$ and that the voltages of the source, the drain and the substrate are 0 V, 0 V, and 3 V.

As illustrated in FIG. 9B, when the width L of the select gate of the select transistor used in the NAND cell unit in this configuration is increased, the channel length is increased. Thus, the cut-off characteristic of the select transistor is improved. However, this indicates that it is necessary for improving the cut-off characteristic of the select transistor to increase the width L of the select gate thereof. Accordingly, with this configuration, a lower limit to the scaling of the select transistor is present. Thus, for example, in a case where the pitch of the word lines is 50 nm, and where 32 nonvolatile memory cells are series-connected, the length of the memory string is about 1600 nm. However, it is difficult to set the width of the select gate of each of the select transistors to be equal to or less than, e.g., 150 nm. In addition, it is necessary to assure two diffusion regions in the substrate. Accordingly, a length of 350 nm is further needed. Consequently, the length of each NAND cell unit on the substrate is large. This causes a problem that an area occupied by each NAND cell unit on the substrate is large.

On the other hand, FIG. 9C enlargedly and schematically illustrates a cross-section of the select transistor in a NAND flash memory according to Embodiment 1 of the invention. The height H of the select gate is a sum of the thicknesses of the conductive layers 604 and 607 and can be set at about 100 nm. On the other hand, the width W of the select gate depends on the formation of the pattern of the photoresist illustrated in FIG. 6B and on the accuracy of the subsequent etching. However, at the filing of the present application, the width of the select gate can be set at about 25 nm using the formation of the pattern according to the sidewall transfer process.

Figure 9D:
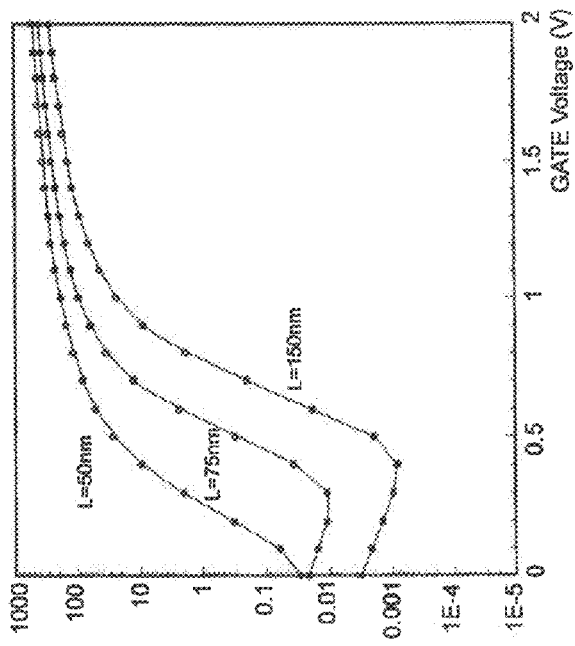
FIG. 9D is a graph illustrating the cut-off characteristic of the select transistor according to Embodiment 1.

Further, FIG. 9D illustrates the relationship between the gate voltage and the source-drain current obtained as a result of simulation in a case where the height and the width of the select gate of the select transistor are set at 100 nm and 25 nm, respectively. Incidentally, in FIG. 9D, the graph illustrated in FIG. 9B in the case of setting the width L of the select gate at 75 nm is also shown for comparison. According to FIG. 9D, it is shown that the cut-off characteristic of the select transistor in the case of setting the height and the width of the select gate of the select transistor to 100 nm and 25 nm, respectively, is improved, as compared with that of the select transistor in the case of setting the width L of the select gate at 75 nm. In Embodiment 1, the channel length is nearly equal to a sum of the width and the height of the select gate. Thus, even when the width of the select gate is set at 25 nm, the channel length can be increased by increasing the height of the select gate to about 100 nm.

According to the comparison between FIGS. 9B and 9D, the cut-off characteristic is improved, in comparison with the case of setting the width L of the select gate at 150 nm. In a case where the height of the select gate is 100 nm, and where the width of the select gate is 25 nm, a sum of the height and the width of the select gate is less than 150 nm. However, it is considered that because the channel is bent like a letter "L", so that the effective channel length is larger than a simple sum of the height and the width of the select gate, the cut-off characteristic is improved, as compared with that in a case where the channel is not bent like a letter "L".

Accordingly, the nonvolatile semiconductor memory device according to Embodiment 1 can reduce an area occupied by the select transistors on the substrate without deteriorating the cut-off characteristic of each of the select transistors.

Embodiment 2

Figure 10A:
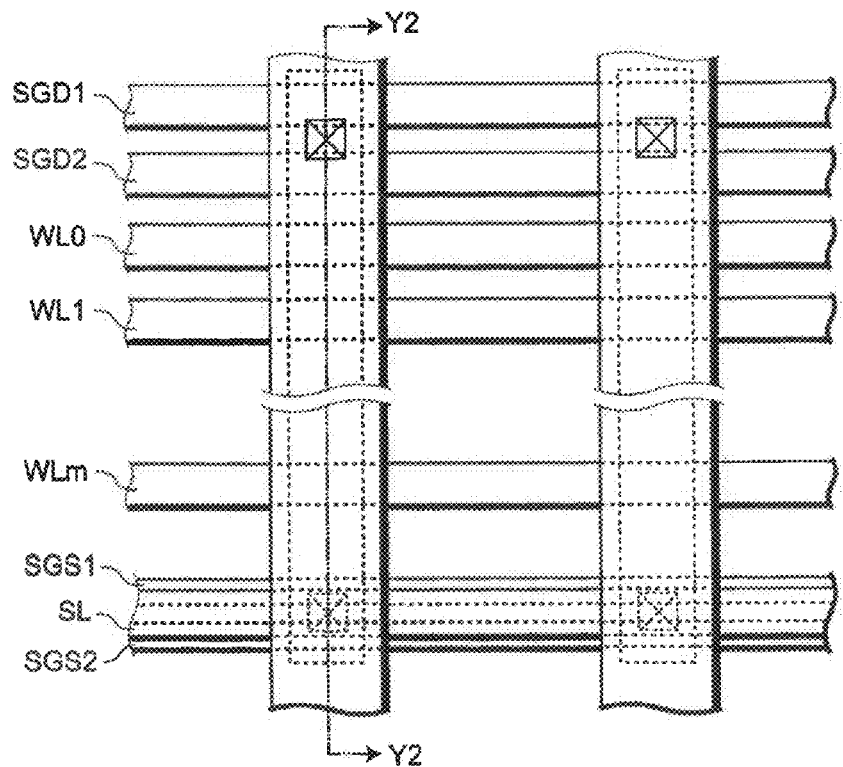
FIGS. 10A and 10B are plan diagrams each illustrating a laminated structure of a memory block of a NAND-type flash memory according to Embodiment 2 the invention.
Figure 10B:
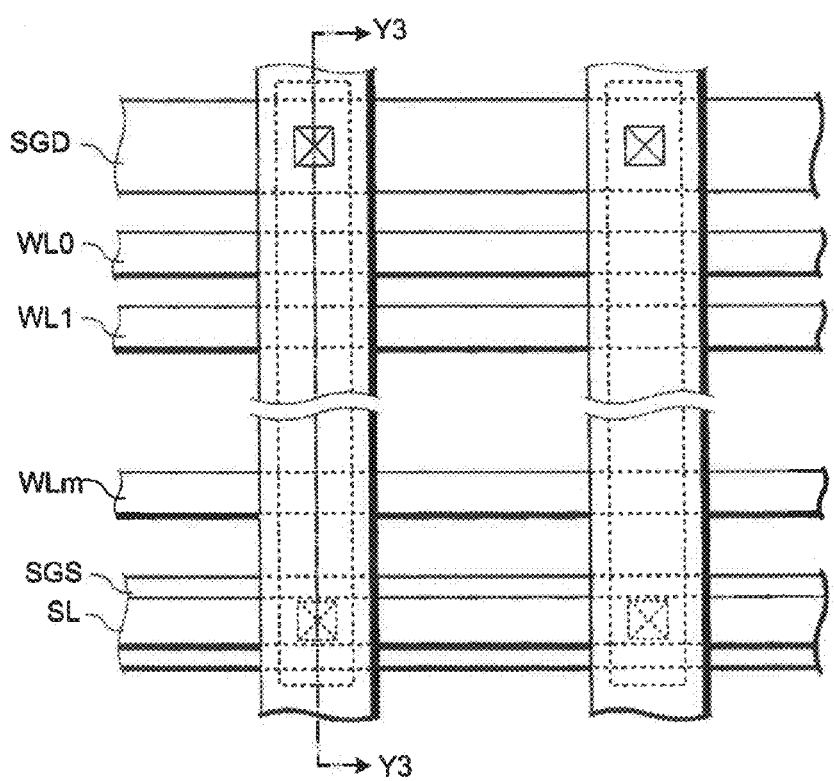

FIGS. 10A and 10B are plan diagrams each illustrating a laminated structure of a memory block of a nonvolatile semiconductor memory device according to Embodiment 2 of the invention. Next, the differences between the laminated structure illustrated in FIGS. 10A and 10B and that illustrated in FIGS. 3A and 3B are briefly described below.

In the laminated structure illustrated in FIGS. 3A and 3B, the one select transistor has the one select gate. The select gate is formed beside the semiconductor pillar 609. On the other hand, in the laminated structure illustrated in FIG. 10A, one select transistor has two select gates. The semiconductor pillar is sandwiched by the two select gates. More specifically, this memory block includes two source-side select gate lines SGS1 and SGS2. The two source-side select gate lines are arranged to sandwich the semiconductor pillar formed as a part of the SL line contact. That is, briefly, the select transistor has a double gate type structure. Similarly, this memory block includes two drain-side select gate lines SGD1 and SGD2. These drain-side select gate lines SGD1 and SGD2 are arranged to sandwich the semiconductor pillar formed as a part of the bit line contact. Further, as illustrated in FIG. 10B, one select transistor includes one select gate, similarly to the laminated structure illustrated in FIGS. 3A and 3B. However, the semiconductor pillar is surrounded by the select gates. That is, the select transistor has a surrounding gate type structure.

Accordingly, on the same conditions, such as the same semiconductor pillar size and the same insulating film thickness, the laminated structures illustrated in FIGS. 3A, 10A and 10B can be arranged in ascending order of the value of an area, in which the select gate of the select transistor is contacted with the semiconductor pillar via the insulating film, as follows, i.e., the laminated structure illustrated in FIG. 3A, that illustrated in FIG. 10A, and that illustrated in FIG. 10B. Thus, when arranged in ascending order of an amount of electric current capable of flowing in the channel while enhancing or maintaining the cut-off characteristic of the select transistor, the laminated structure illustrated in FIG. 3A, that illustrated in FIG. 1A, and that illustrated in FIG. 10B are arranged in this order.

In the simulation result of the cut-off characteristic, it is found that the cut-off characteristic of the select transistor of Embodiment 2 can be improved using the double gate type structure, as compared with that of Embodiment 1.

Figure 11A:
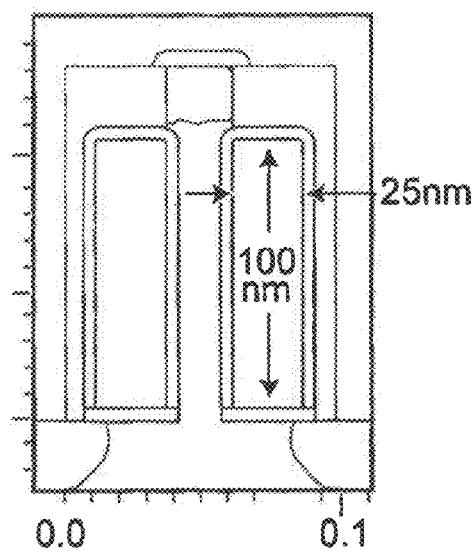
FIG. 11A is a cross-sectional structure diagram illustrating a select transistor according to Embodiment 2.

FIG. 11A illustrates the cross-sectional structure of the select transistor having a double gate type structure used in the simulation. That is, the width of one of the select gates which sandwich the semiconductor pillar is set at 25 nm, similarly to that of the gate illustrated in FIG. 9C. The height of the one of the select gates is set at 100 nm.

Figure 11B:
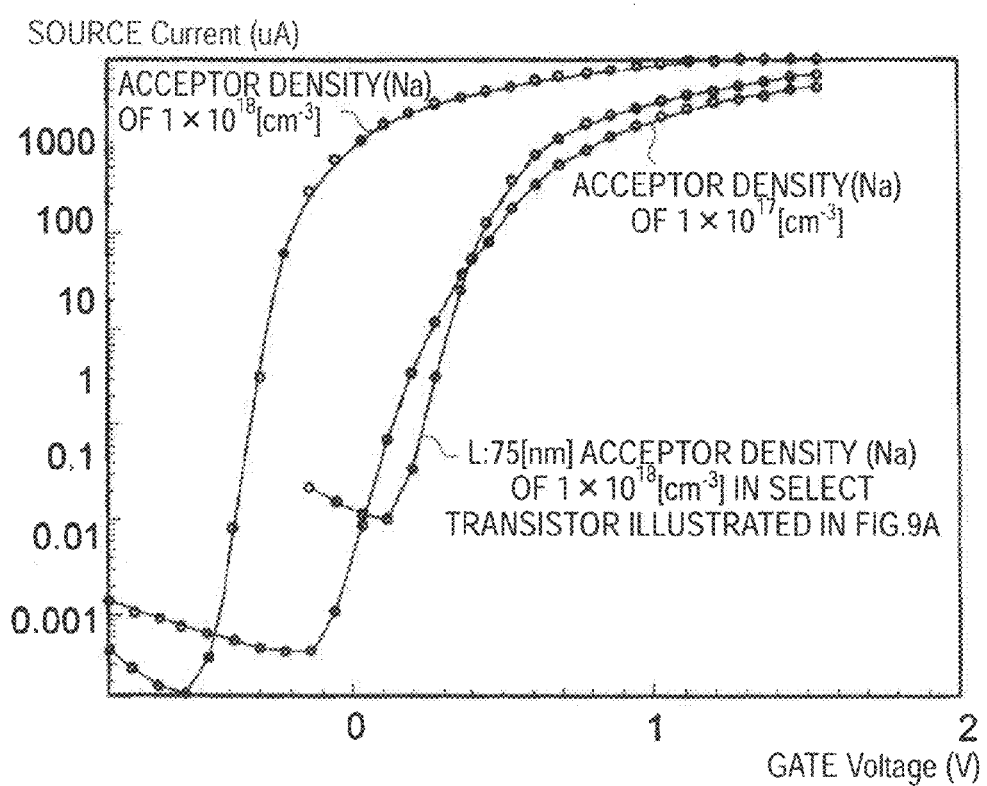
FIG. 11B is a graph illustrating the cut-off characteristic of the select transistor according to Embodiment 2.

FIG. 11B illustrates a result of simulation of the relationship between the gate voltage and the source current in this cross-sectional structure. FIG. 11B illustrates a graph in the case of setting the acceptor density (Na) of a channel region at $1 \times 10^{17}$ cm$^{-3}$ and a graph in the case of setting the acceptor density (Na) of a channel region at $1 \times 10^{18}$ cm$^{-3}$. In addition, for comparison, FIG. 11B illustrates also the relationship between the gate voltage and the source current in the case of setting the width of the gate of the select transistor, whose cross-section is illustrated in FIG. 9A, at 75 mm.

According to these graphs, it is shown that while the width of the select gate on the substrate is reduced, the deterioration of the cut-off characteristic can be prevented by using the select transistors of the double gate type structure and the surrounding gate type structure.

Generally, the term "the double gate structure" indicates a structure in which a semiconductor is simply sandwiched by a plurality of gates, and the term "the surrounding gate structure" indicates a structure in which a semiconductor is simply surrounded by a plurality of gates. In the embodiments, the channel of the select transistor is formed not only in the semiconductor pillar but also in the P-well. Therefore, in the description of the embodiments, the expressions "the double gate structure" and "the surrounding gate structure" are used.

Incidentally, in the structure illustrated in FIGS. 10A and 10B, it is not necessary that both the select transistors connected to both ends of the memory string of the NAND cell unit have the double gate type structure or the surrounding gate type structure. For example, the select transistors can be configured so that one of the select transistors has the structure according to Embodiment 1 and that the other select transistor has the double gate type structure or the surrounding gate type structure.

Figure 12A:
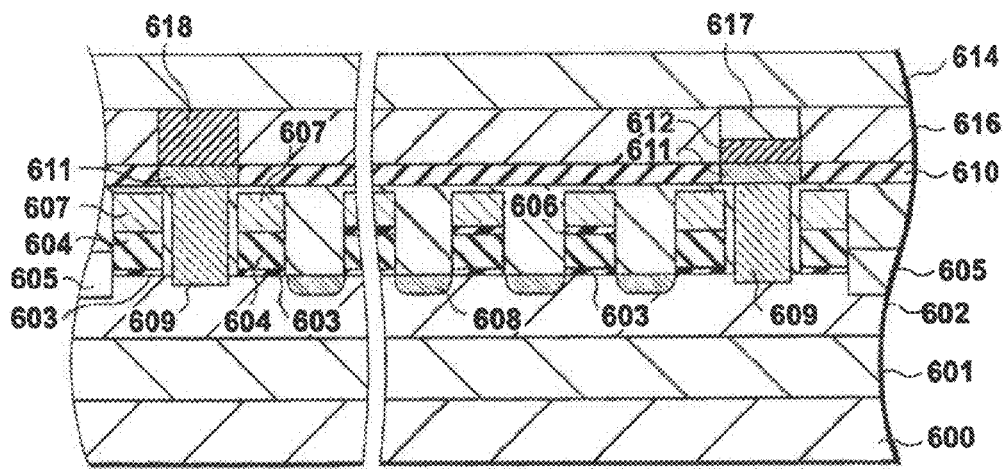
FIG. 12A is a diagram illustrating a laminated structure of a memory block of a NAND-type flash memory according to Embodiment 2.

FIG. 12A illustrates a cross-section taken along line Y2-Y2 shown in FIG. 10A. FIG. 12A differs from FIG. 3B in that the structure illustrated in FIG. 12A is the double gate type structure in which the select gates are arranged on the left side and the right side of the semiconductor pillar 609, as viewed in FIG. 12A. It can be also considered, for the following reason, that FIG. 12A illustrates a cross-section taken along line Y3-Y3 shown in FIG. 10B. That is, the cross-section taken along line Y3-Y3 is similar to the cross-section taken along line Y2-Y2 in that the select gates are present on the left side and the right side of the semiconductor pillar 609, respectively. This is because a cross-section of a graphic consisting of two parallel bars or a torus (ring) graphic having only one hole like a doughnut can be conformed to a cross-section of a torus graphic having two or more holes according to topology of three-dimensional space.

Hereinafter, steps of a process for implementing the laminated structure of a memory block of the nonvolatile semiconductor memory device according to Embodiment 2 are described with reference to the accompanying drawings.

The steps illustrated in FIGS. 4A to 6A, which have been described in the description of Embodiment 1, can be used in Embodiment 2. Thus, it is now assumed that the structure illustrated in the Y1-cross-sectional diagram shown in FIG. 6A is obtained. Incidentally, hereinafter, descriptions to be made with reference to the X1-cross-sectional diagram are omitted.

Figure 12B:
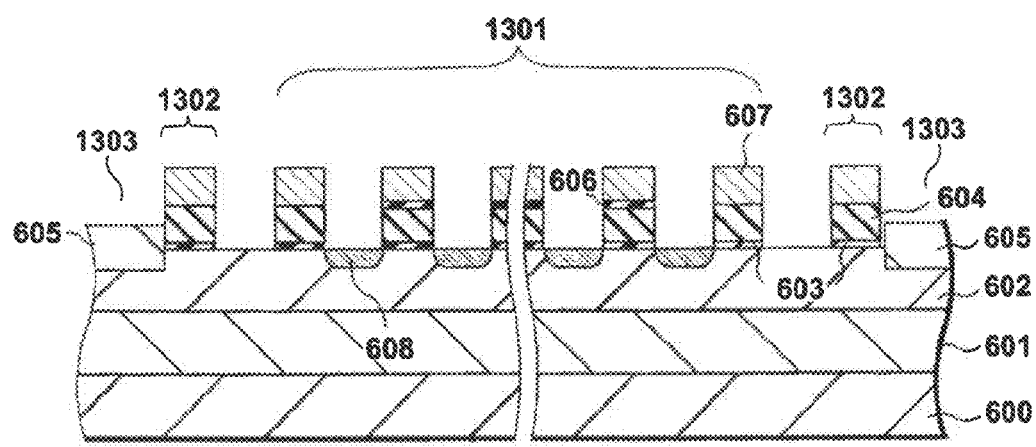
FIGS. 12B, 12C and 13 are diagrams respectively illustrating steps of processing a memory block of the NAND-type flash memory according to Embodiment 2.

FIG. 12B illustrates a structure obtained by forming a pattern on a part of the region 625 illustrated in FIG. 6B to leave resist thereon, then performing etching to form a linear shape perpendicular to the plane of the drawing, and subsequently forming the first diffusion regions. In a region 1301, nonvolatile memory cells, and the select gates of select transistors are formed, similarly to Embodiment 1. In a region 1302, one of the select gates of the double gate type select transistors according to Embodiment 2 is formed.

Alternatively, the select gates of surrounding gate type select transistors are formed to have a certain width so that a hole can be formed therein. Incidentally, sometimes, the width of the select gate of the surrounding gate type select transistor is larger than that of the double gate type select transistor and than that of the select transistor according to Embodiment 1. Thus, it becomes difficult to perform a sidewall transfer process. In such a case, a process for forming nonvolatile memory cells by being isolated from one another needs to be separated from a process for forming the select gates of the surrounding gate type select transistors.

Figure 12C:
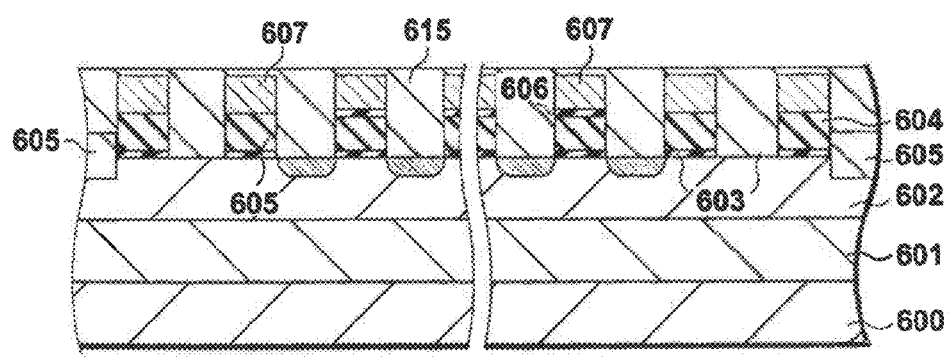
Figure 13:
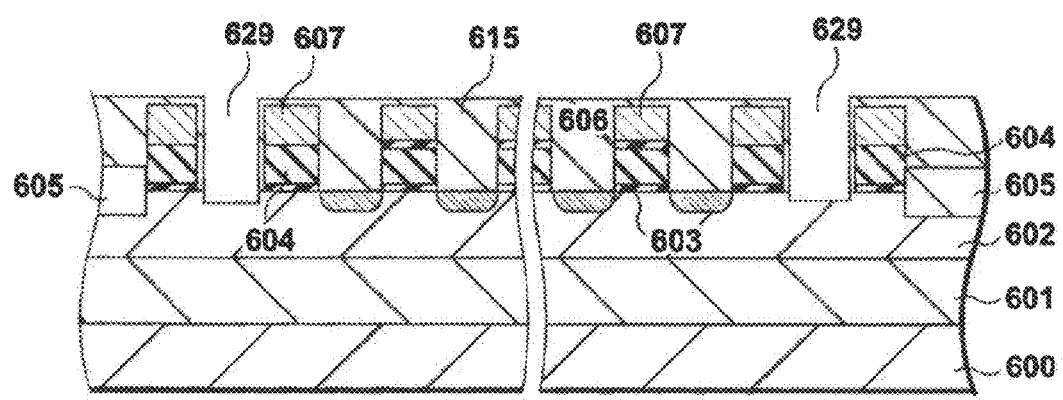

FIG. 12C illustrates a structure in which the structure formed on the substrate is covered with an insulating layer made of an insulating material. This structure is described hereinafter, similarly to the description of Embodiment 1 made with reference to FIG. 7C. FIG. 13 illustrates a structure obtained after the hole 629 is formed.

The hole 629 is formed by step similar to the step of forming the hole 629 which extends from the top surface of the insulating layer 615 of the structure illustrated in FIG. 7C and that reaches the P-well 602.

That is, an example of one process for forming the hole 629 is performed as follows. That is, in a first step, a first hole is formed from the top surface of the insulating layer by slightly etching the select gate of the select transistor. In a second step, an oxide film is formed on the inner surface of the first hole. In a third step, the hole 629 is formed as a second hole by performing anisotropic etching, such as RIE, on the oxide film formed on the bottom surface of the first hole.

Then, an insulating film is formed in the hole 629. Next, the insulating film formed on the bottom surface of the hole 629 is etched. Then, a semiconductor region is formed by epitaxially forming a semiconductor. Subsequently, the planarization of the semiconductor region is performed. Then, processing in steps similar to those according to Embodiment 1 is performed.

Even in Embodiment 2, an area occupied by the select transistor on the substrate can be reduced, without deteriorating the cut-off characteristic of the select transistor, similarly to Embodiment 1. In addition, a larger current can be flown through the channel by using the select gates of the double gate type select transistors or the surrounding gate type select transistors.

Embodiment 3

A nonvolatile semiconductor memory device according to Embodiment 3 of the invention includes nonvolatile memory cells using an oxide-nitride-oxide (ONO) film. Steps of processing to be performed therein are described herein after with reference to FIGS. 14A through 14C and 15A through 15C.

Figure 14A:
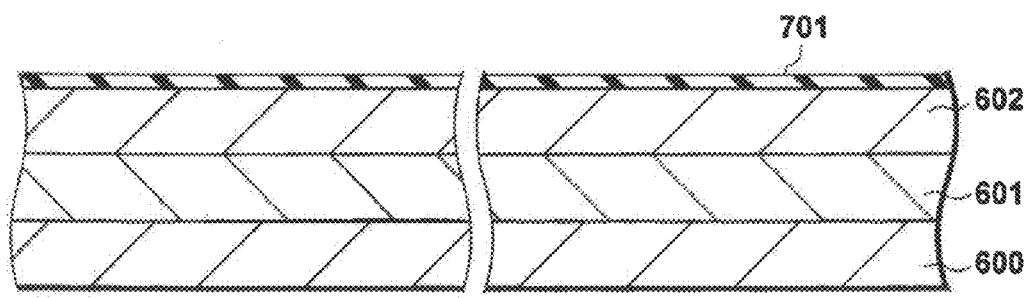
FIGS. 14A to 15C are diagrams respectively illustrating steps of processing a memory block of a NAND-type flash memory according to Embodiment 3 of the invention.
Figure 14B:
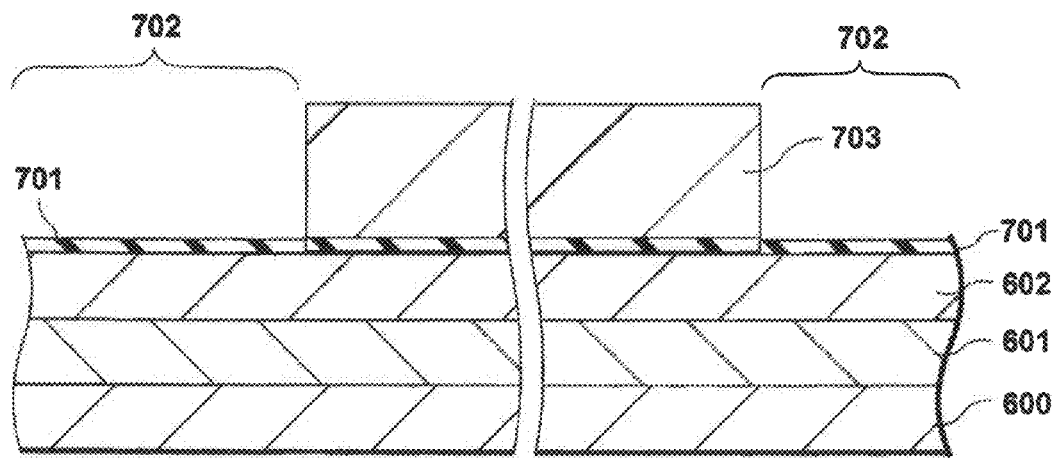
Figure 14C:
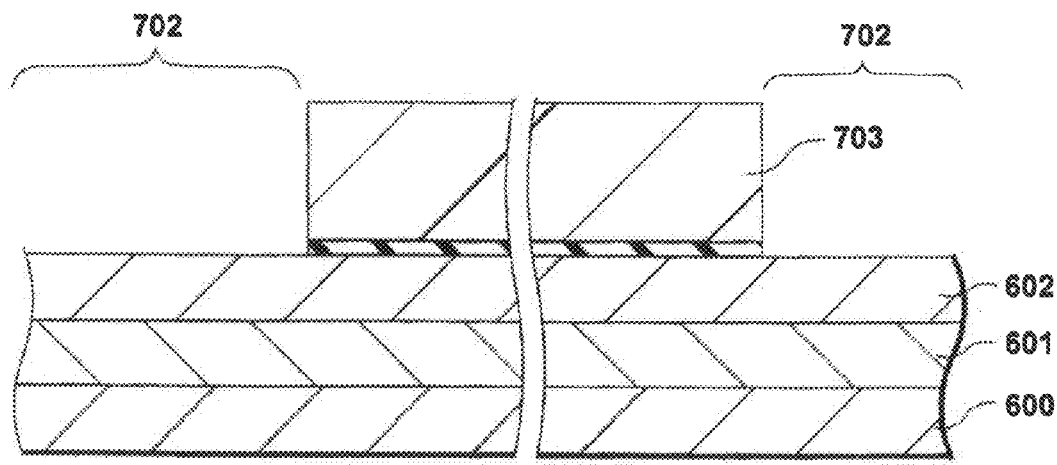
Figure 15A:
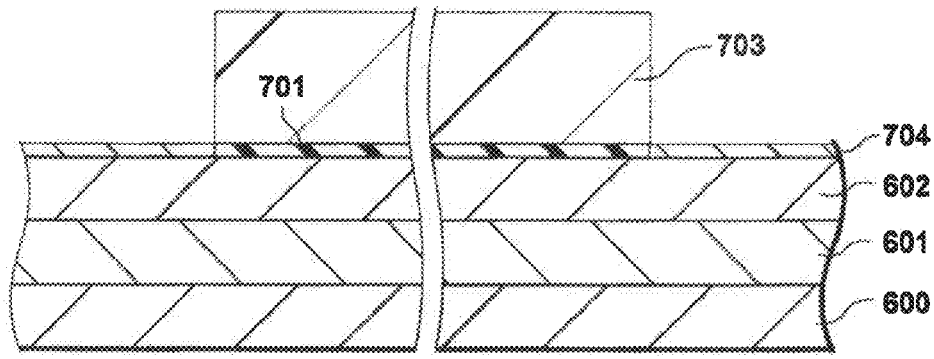

FIG. 14A illustrates a structure in which an ONO film 701 is stacked on the P-type substrate 600, the N-well 601, and the P-well 602. The ONO film is used to form the nonvolatile memory cells. However, the ONO film is unnecessary for forming the select transistors. Thus, a part of the ONO film 701, in which the select transistors are formed, is removed by etching. For that purpose, photoresist 703 is applied onto the ONO film 701. Thus, as illustrated in FIG. 14B, a pattern 702 of a part, in which the select transistors are formed, is formed. Then, etching is performed, as illustrated in FIG. 14C. Thus, a part of the ONO film 701 is removed. Then, as illustrated in FIG. 15A, an insulating film 704 is formed on a part of a surface of the substrate, from which the ONO film 701 is removed.

Figure 15B:
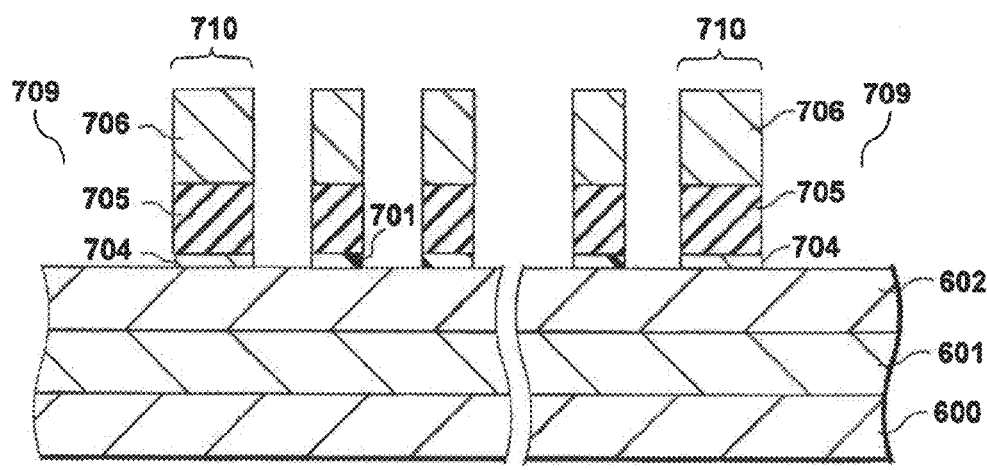

Next, as illustrated in FIG. 15B, a conductive film 705 made of polysilicon is formed. Then, photoresist 706 is applied onto the conductive film 705. Patterns for forming the nonvolatile memory cells and the select gates of the select transistors are formed on the photoresist 706. Then, etching is performed.

Ion implantation is performed on the bottom surface among the nonvolatile memory cells and the select gates of the select transistor. Then, diffusion is performed using, e.g., heat.

Figure 15C:
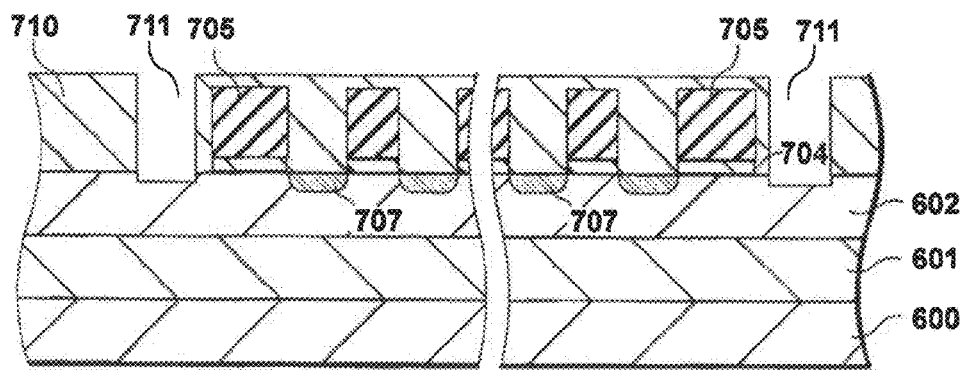

An insulating material, PSG, is deposited on the entire surface thereof. A hole 711 reaching the P-well 602 is formed in the deposited insulating layer 615 having the structure illustrated in FIG. 10A by the same process as that of forming the hole 629 in the insulating layer 615 to reach the P-well 602. Thus, a structure illustrated in FIG. 15C is obtained.

Then, for example, a first hole is formed from the top surface of the insulating layer by slightly etching the select gate of the select transistor in a first step. Then, in a second step, an oxide film is formed on the inner surface of the first hole. In a third step, anisotropic etching, such as RIE, is performed on the oxide film formed on the bottom surface of the first hole. Thus, the hole 711 is formed as a second hole.

The select transistor of the aforementioned structure corresponds to Embodiment 1. Those skilled in the art can easily obtain the double gate type select transistors and the surrounding gate type select transistors described in the description of Embodiment 2 by understanding information disclosed in the present specification.

The reliability of the NAND flash memory is enhanced using the ONO film. The cut-off characteristic of the select transistor can be improved and the miniaturization of the NAND flash memory can be achieved by implementing the structure of the select transistor according to one of the embodiments of the invention.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A nonvolatile semiconductor memory device comprising:
    a semiconductor substrate;
    plural horizontal memory cell transistors that are series-connected; and
    a select transistor that includes:
        a first diffusion region that is formed in the semiconductor substrate at one end of the memory cell transistors;
        a first insulating film that is formed on the semiconductor substrate at a side of the first diffusion region;
        a select gate electrode that is formed on the first insulating film;
        a semiconductor pillar that is formed to extend upward from the semiconductor substrate and to be separated from the select gate electrode;
        a second insulating film that is formed between the select gate electrode and the semiconductor pillar; and
        a second diffusion region that is formed on the semiconductor pillar.

2. The nonvolatile semiconductor memory device according to claim 1,
    wherein the semiconductor substrate and the semiconductor pillar are formed of a P-type semiconductor, and
    wherein the first diffusion layer and the second diffusion layer are formed of an N-type semiconductor.

3. The nonvolatile semiconductor memory device according to claim 1,
    wherein the select gate electrode is functioning as a gate of the select transistor,
    wherein the first diffusion layer and the second diffusion layer are functioning as a source and a drain of the select transistor,
    wherein the first insulating film and the second insulating film are functioning as a gate insulating film of the select transistor, and
    wherein the semiconductor pillar and a part of the semiconductor substrate below the select gate electrode are functioning as a channel region of the select transistor.

4. The nonvolatile semiconductor memory device according to claim 1,
    wherein the select gate electrode is formed so that a height H thereof is larger than a width W thereof.

5. The nonvolatile semiconductor memory device according to claim 1,
wherein the second diffusion region is formed upon a position higher than a top surface of the select gate electrode.

6. The nonvolatile semiconductor memory device according to claim 3,
wherein the select gate electrode is formed so that a height H thereof is larger than a width W thereof.

7. The nonvolatile semiconductor memory device according to claim 3,
wherein the second diffusion region is formed upon a position higher than a top surface of the select gate electrode.

8. The nonvolatile semiconductor memory device according to claim 1,
wherein the second insulating film is formed to have a thickness substantially same as that of the first insulating film.

9. The nonvolatile semiconductor memory device according to claim 1,
wherein the select transistor further includes a second select gate electrode that is disposed to sandwich the semiconductor pillar with the select gate electrode.

10. The nonvolatile semiconductor memory device according to claim 1,
wherein the second insulating film is formed to surround a side surface of the semiconductor pillar, and
wherein the select gate electrode is formed to surround the side surface of the semiconductor pillar through the second insulating film.

11. The nonvolatile semiconductor memory device according to claim 1,
wherein the memory cell transistors include:
first diffusion regions that are formed in the semiconductor substrate;
first insulating films that are formed on the semiconductor substrate between the diffusion regions; and
memory cell gate electrodes that are formed on the first insulating films.

12. The nonvolatile semiconductor memory device according to claim 11,
wherein the memory cell gate electrodes include:
charge accumulation electrodes that are formed on the first insulating films;
inter-electrode insulating films that are formed on the charge accumulation electrodes; and
control electrodes that are formed on the inter-electrode insulating films.

13. The nonvolatile semiconductor memory device according to claim 11,
wherein the select transistor shares the first diffusion layer with one of the memory cell transistors.

14. The nonvolatile semiconductor memory device according to claim 11,
wherein the select gate electrodes is formed to have a width substantially same as that of the memory cell electrodes.

15. The nonvolatile semiconductor memory device according to claim 1,
wherein the semiconductor pillar is formed so that a top surface thereof is positioned higher than a top surface of the select gate electrode.

16. The nonvolatile semiconductor memory device according to claim 1,
the second insulating film is formed of the same material as an embedding insulating layer that is formed on the semiconductor substrate so as to embed the memory cell transistors.

17. The nonvolatile semiconductor memory device according to claim 1,
wherein the semiconductor pillar is formed to have a bottom face positioned lower than a surface of the semiconductor substrate.

18. The nonvolatile semiconductor memory device according to claim 1,
wherein the memory cell transistors include:
first diffusion regions that are formed in the semiconductor substrate;
charge accumulation films that are formed on the semiconductor substrate between the diffusion regions; and
memory cell gate electrodes that are formed on the charge accumulation films.

19. The nonvolatile semiconductor memory device according to claim 18,
wherein the charge accumulation film includes an ONO film.

* * * * *